US 7,928,803 B2

(12) United States Patent
Arai (10) Patent No.: US 7,928,803 B2
(45) Date of Patent: Apr. 19, 2011

(54) AMPLIFYING CIRCUIT

(75) Inventor: Tomoyuki Arai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/652,816

(22) Filed: Jan. 6, 2010

(65) Prior Publication Data

US 2010/0109777 A1 May 6, 2010

Related U.S. Application Data

(63) Continuation of application No. PCT/JP2007/064889, filed on Jul. 30, 2007.

(51) Int. Cl.
*H03F 3/68* (2006.01)
(52) U.S. Cl. ............ 330/295; 330/124 R; 330/296
(58) Field of Classification Search .......... 330/295, 330/124 R, 296
See application file for complete search history.

(56) References Cited

U.S. PATENT DOCUMENTS

| 4,719,369 A * | 1/1988 | Asano et al. .................. 326/30 |
| 6,229,370 B1 * | 5/2001 | Inamori et al. ............... 327/308 |
| 7,257,382 B2 * | 8/2007 | Arai et al. ..................... 455/91 |
| 7,437,129 B2 * | 10/2008 | Nakajima et al. ............. 455/83 |
| 7,482,879 B2 * | 1/2009 | Koutani et al. ............. 330/311 |
| 2002/0118065 A1 | 8/2002 | Miyamoto |
| 2004/0090267 A1 | 5/2004 | Nagamori et al. |

FOREIGN PATENT DOCUMENTS

| JP | 03048506 | 3/1991 |
| JP | 10303655 | 11/1998 |
| JP | 2002330039 | 11/2002 |
| JP | 2004159123 | 6/2004 |
| WO | 2007108102 | 9/2007 |

OTHER PUBLICATIONS

International Search Report based on International application No. PCT/JP2007/064889, dated Sep. 11, 2007.
"Design of Analog CMOS integrated Circuits", McGraw-Hill Publishing Co., pp. 393 dated Oct. 1, 2003.
International Preliminary Report on Patentability dated Feb. 11, 2010 in the corresponding International Patent Application No. PCT/JP2007/064889.

* cited by examiner

*Primary Examiner* — Patricia Nguyen
(74) *Attorney, Agent, or Firm* — Fujitsu Patent Center (57) ABSTRACT

An amplifying circuit includes amplifying unit comprising a first transistor unit having a gate width that is controllable and is controlled based on a first control signal.

17 Claims, 13 Drawing Sheets

| TEMPERATURE [K] | TEMPERATURE [°C] | $Wg/Wg_{20°C}$ | CODE[3:1] |
|---|---|---|---|
| 243 | -30 | 0.73 | 000 |
| 253 | -20 | 0.78 | 000 |
| 263 | -10 | 0.83 | 001 |
| 273 | 0 | 0.89 | 001 |
| 283 | 10 | 0.94 | 010 |
| 293 | 20 | 1.00 | 010 |
| 303 | 30 | 1.06 | 010 |
| 313 | 40 | 1.12 | 011 |
| 323 | 50 | 1.18 | 011 |
| 333 | 60 | 1.24 | 100 |
| 343 | 70 | 1.31 | 100 |
| 353 | 80 | 1.37 | 100 |
| 363 | 90 | 1.44 | 101 |
| 373 | 100 | 1.51 | 101 |
| 383 | 110 | 1.58 | 110 |
| 393 | 120 | 1.65 | 110 |
| 403 | 130 | 1.72 | 111 |

AMPLIFYING CIRCUIT

FIELD

The embodiments discussed herein are related to an amplifying circuit used in an analog circuit.

BACKGROUND

The gain of an amplifier is dependent on the mutual conductance "gm" of each transistor constituting the amplifier and the load connected to the transistor. Mutual conductance gm varies depending on the manufacturing process of the transistor and the temperature of the transistor. Therefore, compensation of mutual conductance gm is important to compensate the gain of the amplifier. Hence, a conventional amplifying circuit compensates gain by using a circuit that compensates mutual conductance gm (hereinafter, "gm compensating circuit").

Figure 13:
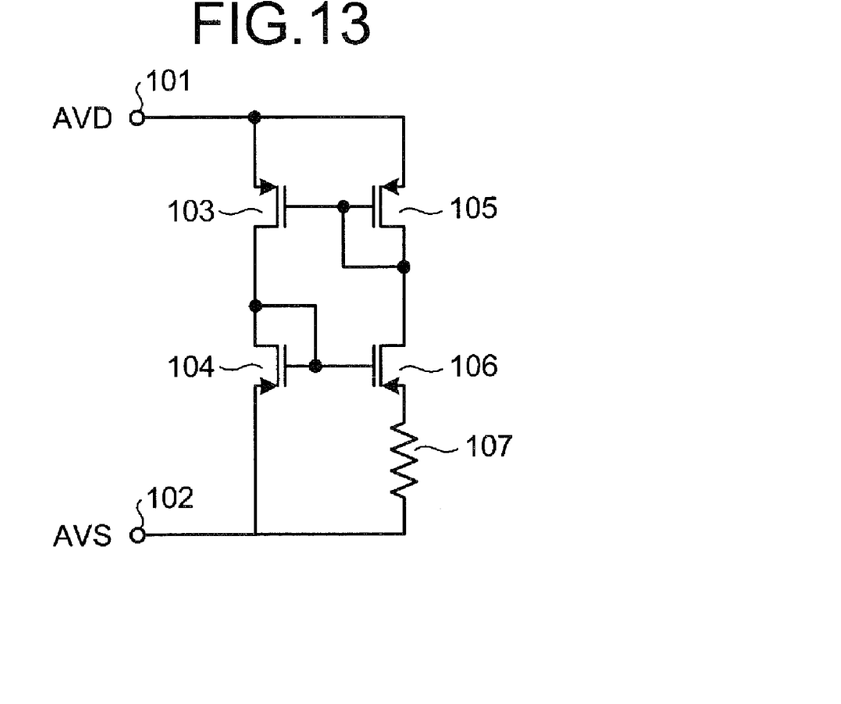
FIG. 13 is a circuit diagram of a conventional gm compensating circuit.

FIG. 13 is a circuit diagram of a conventional gm compensating circuit. As depicted in FIG. 13, in the conventional gm compensating circuit, a PMOS transistor 103 and an NMOS transistor 104 are connected in series between a positive power terminal (AVD) 101 and a ground (AVS) 102. A PMOS transistor 105, an NMOS transistor 106, and a resistor 107 are connected in series between the positive power terminal (AVD) 101 and the ground (AVS) 102.

Gate terminals of the PMOS transistors 103 and 105 are commonly connected to a drain terminal of the PMOS transistor 105. Gate terminals of the NMOS transistors 104 and 106 are commonly connected to a drain terminal of the NMOS transistor 104. In this gm compensating circuit, the mutual conductance gm of the NMOS transistor 106 is controlled to be constant. A gm compensating circuit configured as above is disclosed in: for example, Behzad Razavi, "Design of Analog CMOS Integrated Circuits", McGraw-Hill Publishing Co., USA, Oct. 1, 2003, p. 393.

Figure 14:
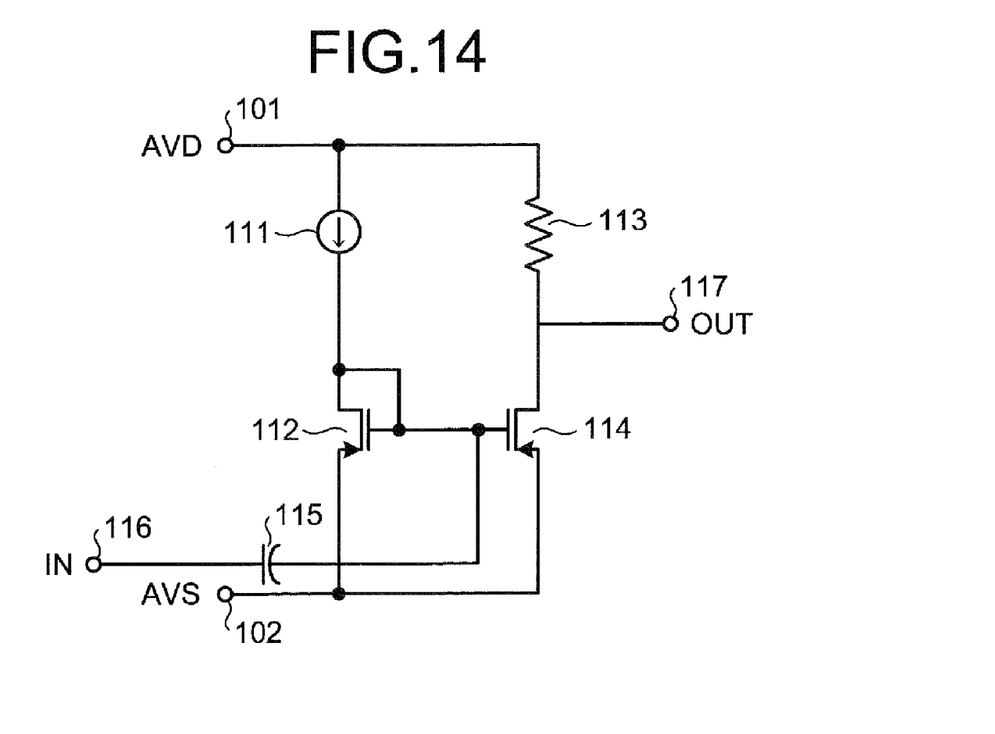
FIG. 14 is a circuit diagram of a conventional amplifying circuit.

FIG. 14 is a circuit diagram of a conventional amplifying circuit. As depicted in FIG. 14, the conventional amplifying circuit is configured by a biasing unit including a current source 111 and an NMOS transistor 112 connected between the positive power terminal (AVD) 101 and the ground (AVS) 102, and an amplifying unit including a loading resistor 113 and an NMOS transistor 114 connected between the positive power terminal (AVD) 101 and the ground (AVS) 102. Gate terminals of the NMOS transistors 112 and 114 are commonly connected to a drain terminal of the NMOS transistor 112.

A gate terminal of the NMOS transistor 114 is connected to an input terminal (IN) 116 through a capacitor 115. A drain terminal of the NMOS transistor 114 is connected to an output terminal (OUT) 117. In the conventional amplifying circuit, by using the gm compensating circuit as depicted in FIG. 13 to equalize the gate widths and the gate lengths of the NMOS transistor 106 of the gm compensating circuit and NMOS transistor 114 of the amplifying circuit, the same amount of current that flows through the NMOS transistor 106 of the gm compensating circuit is caused to flow from the current source 111 of the amplifying circuit by a current mirror. Thereby, a gate-source voltage Vgs (gate bias Vg) of the NMOS transistor 114 of the amplifying circuit is controlled and the mutual conductance gm of the NMOS transistor 114 is compensated. Therefore, the gain is compensated.

Figure 15:
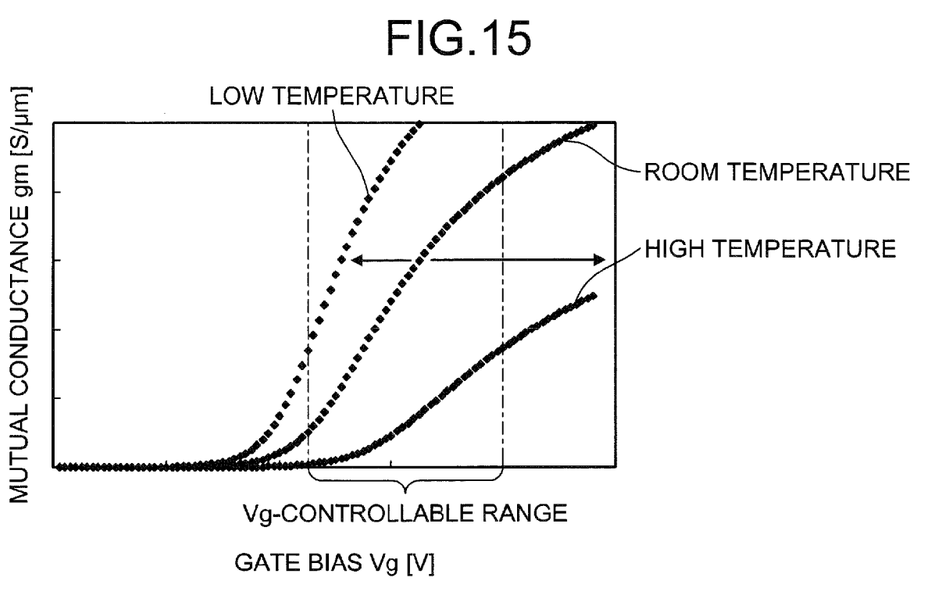
FIG. 15 is a schematic depicting the relation between the mutual conductance gm and the gate bias Vg of the conventional amplifying circuit.

FIG. 15 is a schematic depicting the relation between the mutual conductance gm and the gate bias Vg of the conventional amplifying circuit. As depicted in FIG. 15, variation of a characteristic curve under low-temperature conditions is steep compared to a characteristic curve under room-temperature conditions. On the other hand, variation of a characteristic curve under high-temperature conditions is gradual. To keep the mutual conductance gm constant when the temperature varies, the gate bias Vg is varied according to the variation of the temperature as depicted by the arrow in FIG. 15.

However, the above conventional amplifying circuit has the following problem. When the amplitude of a signal to be amplified is large and the gate bias point is high, if the amplifying circuit is in the high-temperature condition and the mutual conductance gm is low, the gate bias Vg that is able to keep the mutual conductance gm constant exceeds a controllable range (see FIG. 15). Therefore, the mutual conductance gm may not be compensated by merely controlling the gate bias Vg. In this case, the gain of the amplifying circuit is unable to be compensated.

SUMMARY

According to an aspect of an embodiment, an amplifying circuit includes amplifying unit comprising a first transistor unit having a gate width that is controllable and is controlled based on a first control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the accompanying drawings.

The present invention is not limited by the following embodiments. In the following description, "n" represents an integer of two or greater. Further, in the following embodiments, similar components are given the same reference numeral and redundant description is omitted.

Figure 1:
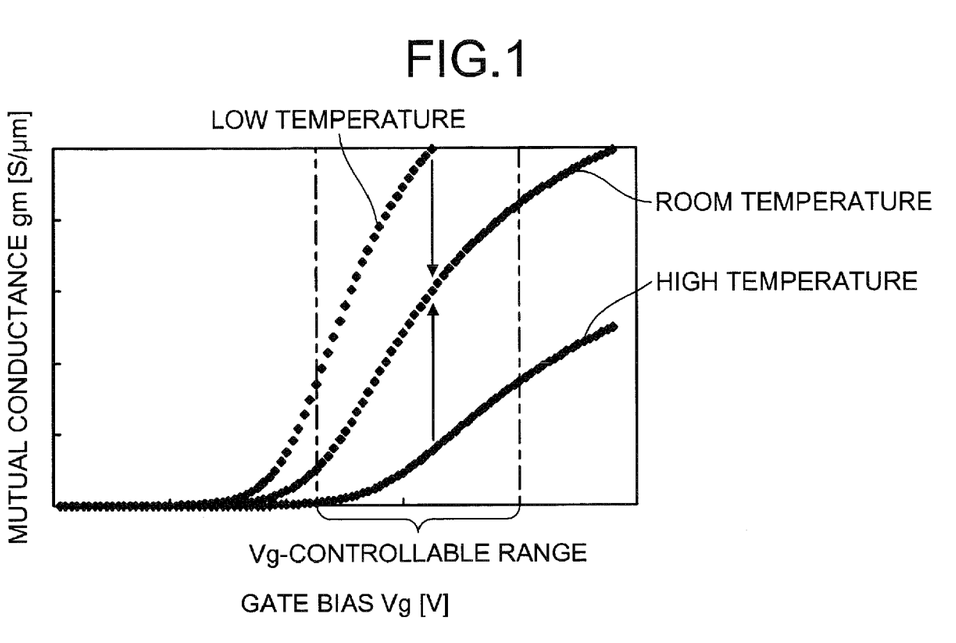
FIG. 1 is a schematic depicting the relation between the mutual conductance gm and the gate bias Vg of an amplifying circuit according to the present embodiments.

FIG. 1 is a schematic depicting the relation between the mutual conductance gm and the gate bias Vg of an amplifying circuit according to the present embodiments. As depicted by the arrows in FIG. 1, the gate widths of transistors for amplification are controlled. For example, by lowering the mutual conductance gm under low temperature conditions and raising the mutual conductance gm under high temperature conditions, mutual conductance is brought close to that under room-temperature conditions.

Figure 2:
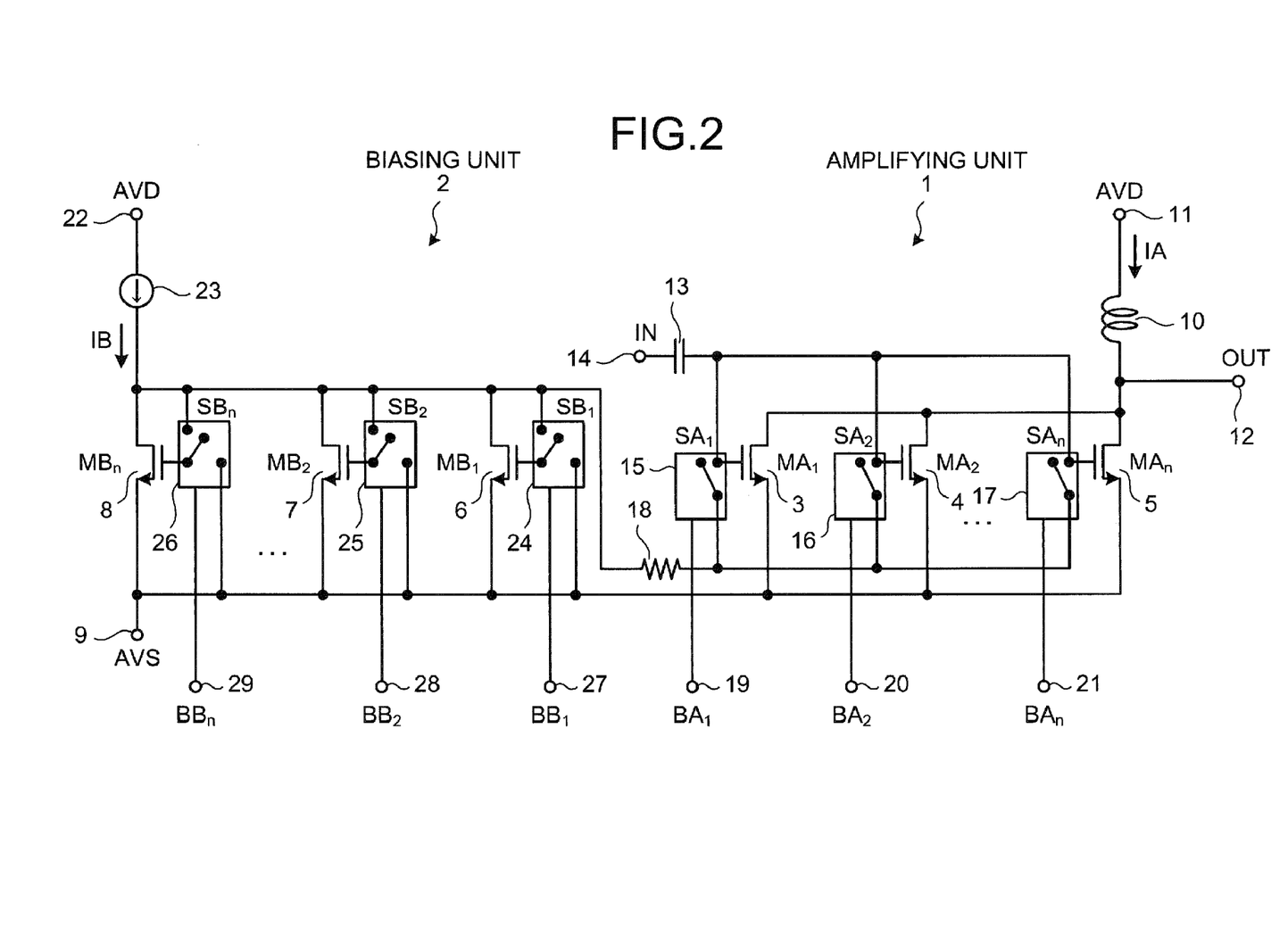
FIG. 2 is a circuit diagram of an amplifying circuit according to a first embodiment.

FIG. 2 is a circuit diagram of an amplifying circuit according to a first embodiment. As depicted in FIG. 2, in the amplifying circuit according to the first embodiment, an amplifying unit 1 includes n NMOS transistors 3, 4, and 5 having gates of the same gate length and different gate widths. A biasing unit 2 includes n NMOS transistors 6, 7, and 8 having gates of the same gate length and different gate widths. Although three NMOS transistors are depicted respectively in the amplifying unit and the biasing unit in FIG. 2, the number of transistors in each unit may be two or may be four or more.

In the following description, to distinguish the NMOS transistors in the amplifying unit 1 and those in the biasing unit 2 from each other, each of the NMOS transistors in the amplifying unit 1 is denoted by "MA" and each of the NMOS transistors in the biasing unit 2 is denoted by "MB". When the respective n NMOS transistors MA in the amplifying unit 1 are to be described being distinguished from each other, a corresponding subscript of "1", "2", and "n" is appended to "MA" and the transistors are denoted as "transistor $MA_1$", "transistor $MA_2$", and "transistor $MA_n$", respectively.

The same denoting method is also adopted for the n NMOS transistors MB in the biasing unit 2. Switches and control terminals described hereinafter are respectively denoted as "SA" and "BA" in the amplifying unit 1 and as "SB" and "BB" in the biasing unit 2 and, when the respective switches and the respective control terminals are distinguished from each other, a corresponding subscript of "1", "2", and "n" is appended to "SA", "BA", "SB", and "BB".

In the n transistors MA 3, 4, and 5 in the amplifying unit 1, source terminals are connected to a ground (AVS) 9. Drain terminals are connected to a positive power terminal (AVD) 11 through a coil 10 and are also connected to an output terminal (OUT) 12 of the amplifying circuit. Gate terminals are connected to an input terminal (IN) 14 of the amplifying circuit through a capacitor 13.

The gate terminals of the transistors $MA_1$ 3, $MA_2$ 4, and $MA_n$ 5 are connected to a resistor 18 respectively through switches $SA_1$ 15, $SA_2$ 16, and $SA_n$ 17. These switches $SA_1$ 15, $SA_2$ 16, and $SA_n$ 17 each switch between "ON" and "OFF" according to control signals input respectively from the control terminals $BA_1$ 19, $BA_2$ 20, and $BA_n$ 21.

In n transistors MB 6, 7, and 8 of the biasing unit 2, source terminals are connected to the ground (AVS) 9. Drain terminals are connected to a current source 23 connected between the drain terminals and a positive power terminal (AVD) 22. The drain terminals are also connected to the resistor 18. That is, through the resistor 18, the biasing unit 2 supplies a bias to each of the transistors MA 3, 4, and 5 of the amplifying unit 1.

Each of the gate terminals of the transistors $MB_1$ 6, $MB_2$ 7, and $MB_n$ 8 is connected to any one among the drain terminal respectively thereof and the ground (AVS) 9 by the switch $SB_1$ 24, $SB_2$ 25, and $SB_n$ 26 corresponding thereto. The switches $SB_1$ 24, $SB_2$ 25, and $SB_n$ 26 switch the connection destinations of the gate terminals according to control signals input respectively from the control terminals $BB_1$ 27, $BB_2$ 28, and $BB_n$ 29.

Each of the transistors MA 3, 4, and 5 and MB 6, 7, and 8 is formed by, for example, connecting unit transistors of the same gate length and the same gate width in parallel. The number of unit transistors connected in parallel in each of the transistors $MA_1$ 3, $MA_2$ 4, and $MA_n$ 5 is different. Similarly, the number of unit transistors connected in parallel in each of the transistors $MB_1$ 6, $MB_2$ 7, and $MB_n$ 8 is different.

Without limitation hereto, the number of unit transistors may be, for example, the same for each of the combinations of the transistors $MA_1$ 3 and $MB_1$ 6, $MA_2$ 4 and $MB_2$ 7, and $MA_n$ 5 and $MB_n$ 8. The levels of the control signals input may be the same or may be different for each of the combinations of the control terminals $BA_1$ 19 and $BB_1$ 27, $BA_2$ 20 and $BB_2$ 28, and $BA_n$ 21 and $BB_n$ 29.

In a first transistor unit including the transistors MA 3, 4, and 5 of the amplifying unit 1, transistors that contribute to amplification of an input signal are the transistors whose gate terminals are connected to the biasing unit 2, that is, transistors to each of which a bias is supplied when the switches SA 15, 16, and 17 are turned on. By changing the combination of the transistors that contribute to the amplification, the gate width of the first transistor unit is varied and thereby, the compensation of the mutual conductance gm and consequently, the compensation of the gain in the first transistor unit are enabled.

In a second transistor unit including the transistors MB 6, 7, and 8 of the biasing unit 2, transistors that contribute to supplying a bias to the amplifying unit 1 are the transistors whose gate terminals are each connected to the drain terminal thereof, that is, transistors that are turned on when the switches SB 24, 25, and 26 are turned on. By changing the combination of the transistors that contribute to the supply of the bias, the gate width of the second transistor unit is varied and thereby, the compensation of the linearity of the amplification characteristic of the amplifying unit 1 is enabled.

An approach of compensation with respect to the temperature of the amplifying circuit depicted in FIG. 2 will be described. Current flowing through the coil 10 in the amplifying unit 1 is denoted by "IA" and current flowing from the current source 23 in the biasing unit 2 is denoted by "IB". Typically, drain-source current Ids of a transistor is expressed by equation (1'). The mutual conductance gm is expressed by equation (2'). However, in equations (1') and (2'), an overdrive voltage Vod is expressed by equation (3') using the gate bias Vg and a threshold voltage Vth. "β" is expressed by equation (4') using a gate width Wg, a gate length Lg, the mobility μ, and the gate capacitance per unit area C0.

$$Ids = \beta/2 \times Vod^2 \quad (1')$$

$$gm = \beta \times Vod \quad (2')$$

$$Vod = Vg - Vth \quad (3')$$

$$\beta = \mu C_0 Wg/Lg \quad (4')$$

For example, in the amplifying circuit depicted in FIG. 2, when the currents IA and IB and the mutual conductance gm are controlled to be constant, equation (5') holds from equations (1') and (2').

$$Ids/gm = Vod/2 \quad (5')$$

From equation (5'), the overdrive voltage Vod is constant under a condition that the mutual conductance gm and the drain-source current Ids are constant. From equation (2'), assuming that the mutual conductance gm and the overdrive voltage Vod are constant, a variable that varies when the temperature varies is β, i.e., the mobility μ from equation (4'). Controlling the gate width Wg of the first transistor unit in the amplifying unit 1 and that of the second transistor unit of the biasing unit 2 to enable compensation of the variation of the mobility μ, enables compensation of the mutual conductance gm.

In the first embodiment, the gate width Wg of the first transistor unit and of the second transistor unit is controlled to be in proportion to 1/μ. When the gate width Wg is controlled to be in proportion to 1/μ by flowing a constant current, the mutual conductance gm and the overdrive voltage Vod may be set to be constant, thereby enabling compensation of the gain and the linearity of the amplifying circuit.

Figure 3:
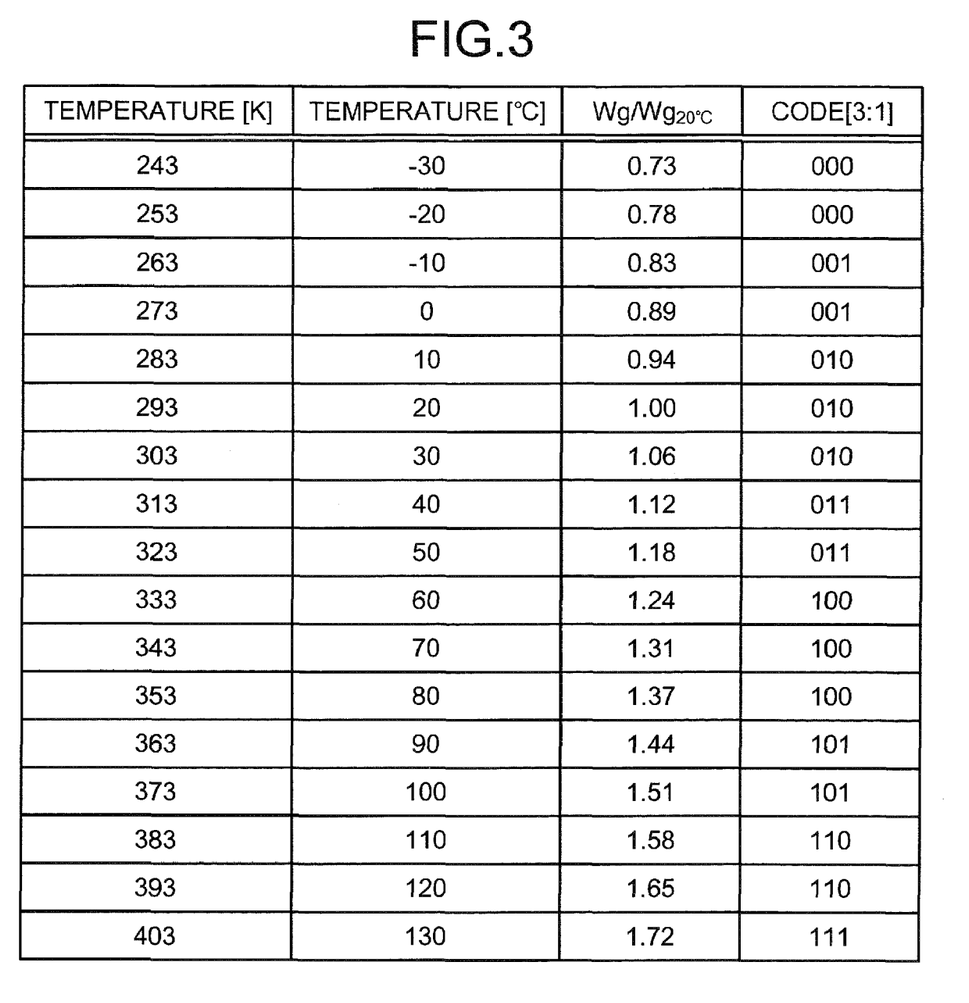
FIG. 3 is schematic depicting an example of a control signal of the amplifying circuit according to the first embodiment.

An example where "n" is three and the gate width Wg is controlled by a three-bit control signal will be described. FIG. 3 is schematic depicting an example of a control signal of the amplifying circuit according to the first embodiment. In this example, it is assumed that the temperature is compensated in a temperature range from −30° C. (243K) to 130° C. In FIG. 3, "Wg/Wg$_{20° C.}$" represents a value of the gate width Wg at each temperature obtained when it is assumed that the gate width Wg at 20° C. is one and the mobility μ is in proportion to the −1.7th power of the absolute temperature T (T−1.7).

"Code [3:1]" represents a three-bit control signal. "LSB" corresponds to a signal input into the control terminals BA$_1$ 19 and BB$_1$ 27. "MSB" corresponds to a signal input into the control terminals BA$_n$ 21 and BB$_n$ 29. Although the number of unit transistors is not specifically limited, the number may be, for example, one for the transistors MA$_1$ 3 and MB$_1$ 6, respectively; two for the transistors MA$_2$ 4 and MB$_2$ 7, respectively; and four for the transistors MA$_n$ 5 and MB$_n$ 8, respectively.

In this example, the code [3:1] and the number of the unit transistors that are turned on are as follows. The number of the unit transistors is zero when the code is "000". The number of the unit transistors is one when the code is "001". The number of the unit transistors is two when the code is "010". The number of the unit transistors is three when the code is "011". The number of the unit transistors is four when the code is "100". The number of the unit transistors is five when the code is "101". The number of the unit transistors is six when the code is "110". The number of the unit transistors is seven when the code is "111".

Figure 4:
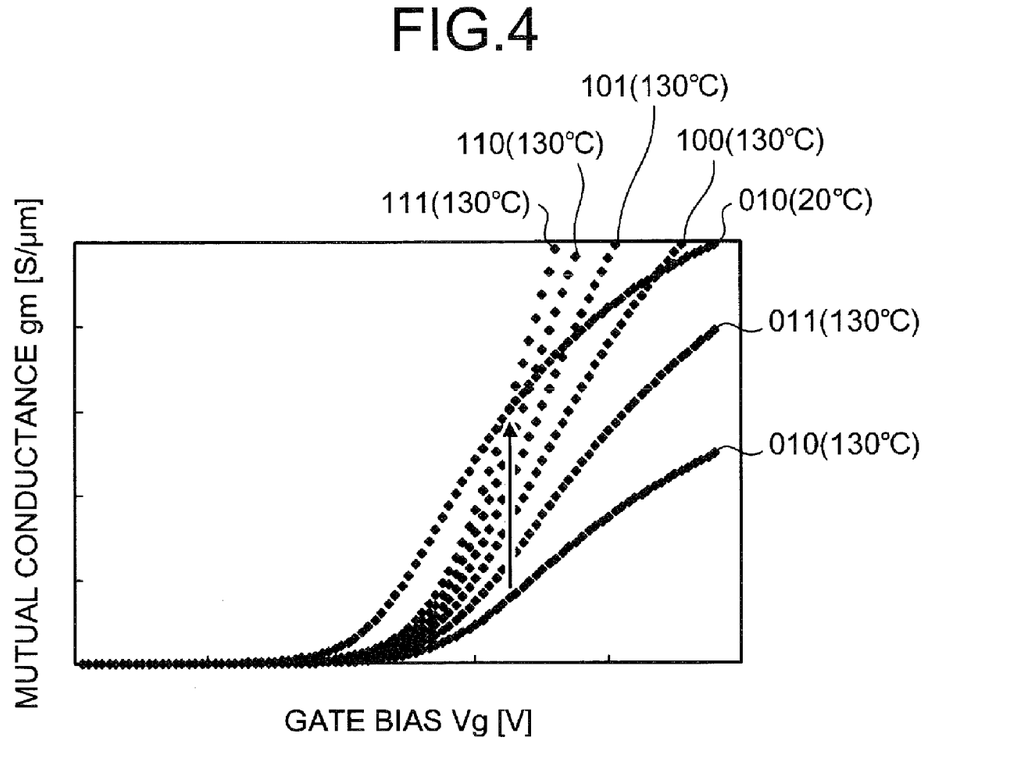
FIG. 4 is a schematic depicting the relation among the control signal, the mutual conductance gm, and the gate bias Vg of the amplifying circuit according to the first embodiment.

FIG. 4 is a schematic depicting the relation among the control signal, the mutual conductance gm, and the gate bias Vg of the amplifying circuit according to the first embodiment, and depicts variation of the characteristic curves obtained when the code [3:1] depicted in FIG. 3 is varied. FIG. 4 depicts an example for 130° C. In FIG. 4, a characteristic curve denoted by "010(20° C.)" depicts a case where the temperature is 20° C. and the code [3:1] is "010". However, when the temperature is 130° C., the mutual conductance gm is reduced and therefore, a characteristic curve denoted by "010(130° C.)" results. The gate width Wg is widened by changing the code [3:1] such that more transistors are turned on. Thereby, as depicted by the arrow in FIG. 4, the characteristic curve for 130° C. becomes close to the characteristic curve of 010(20° C.) and thereby, the mutual conductance gm is compensated. By setting the current flowing in the biasing unit 2 and the current flowing in the amplifying unit 1 to be constant, the mutual conductance gm is compensated keeping the overdrive voltage (voltage between the gate bias and the threshold voltage) constant enabling the linearity to be compensated simultaneously.

Figure 5:
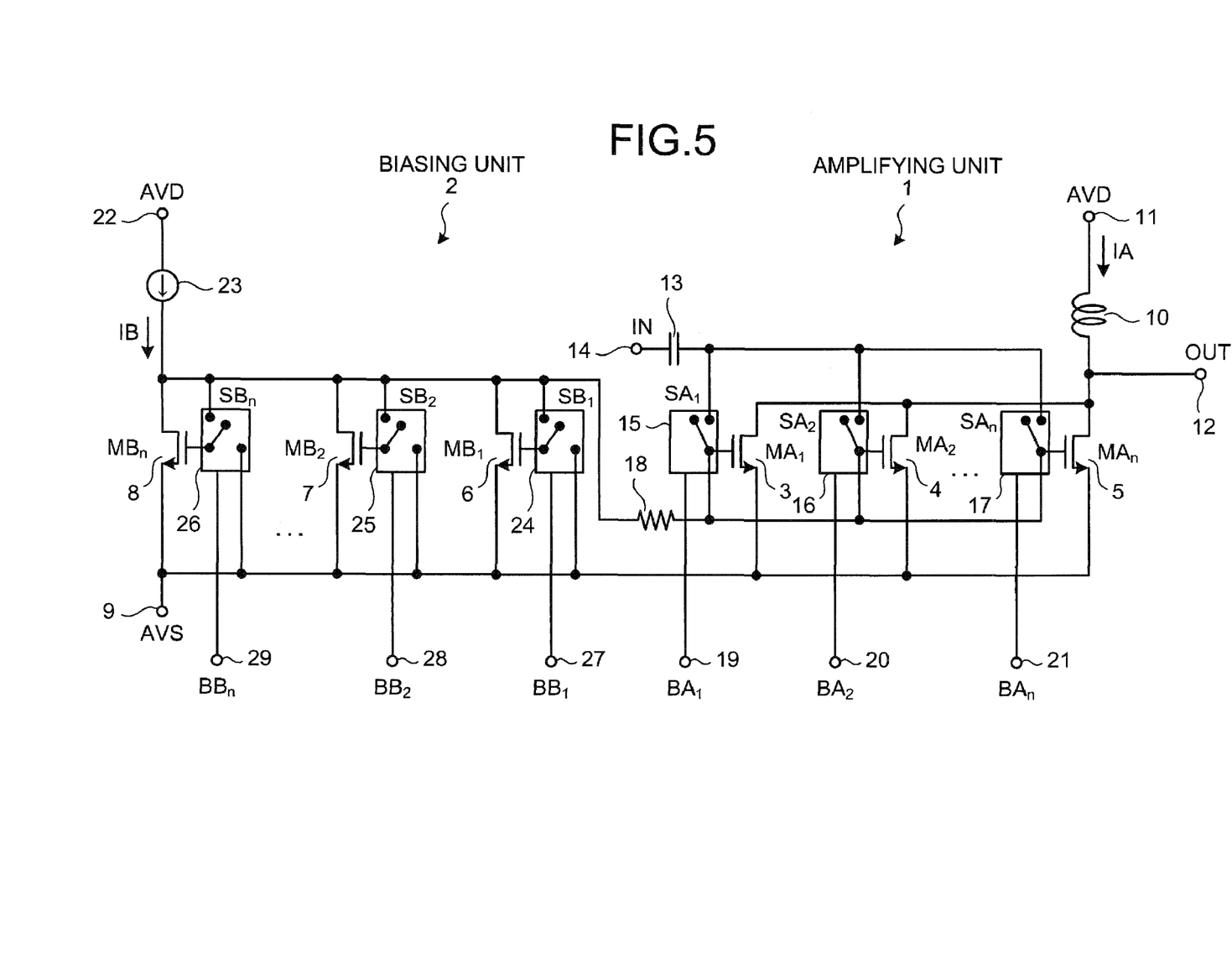
FIG. 5 is a circuit diagram of an amplifying circuit according to a second embodiment.

FIG. 5 is a circuit diagram of an amplifying circuit according to a second embodiment. As depicted in FIG. 5, in the amplifying circuit according to the second embodiment, in the amplifying unit 1, the gate terminals of the transistors MA 3, 4, and 5 are connected to the biasing unit 2 through the resistor 18. Although the gate terminals are connected to the input terminal (IN) 14 through the capacitor 13, this connection is controlled by the opening and closing of the switches SA 15, 16, and 17. Other aspects of the configuration are identical to those in the first embodiment.

The respective gate terminals of the transistors MA 3, 4, and 5 of the amplifying unit 1 are continuously supplied with a bias from the biasing unit 2. However, input signals are input to only the transistors whose gate terminals have been connected to the input terminal (IN) 14 through the capacitor 13 by the switches SA 15, 16, and 17 in an "on" state. That is, in contrast to the first embodiment where the number of transistors applied with the bias is varied according to temperature variation, in the second embodiment, the number of transistors to which input signals are input is varied. The transistors to which input signals are input contribute to the amplification of the input signal.

Figure 6:
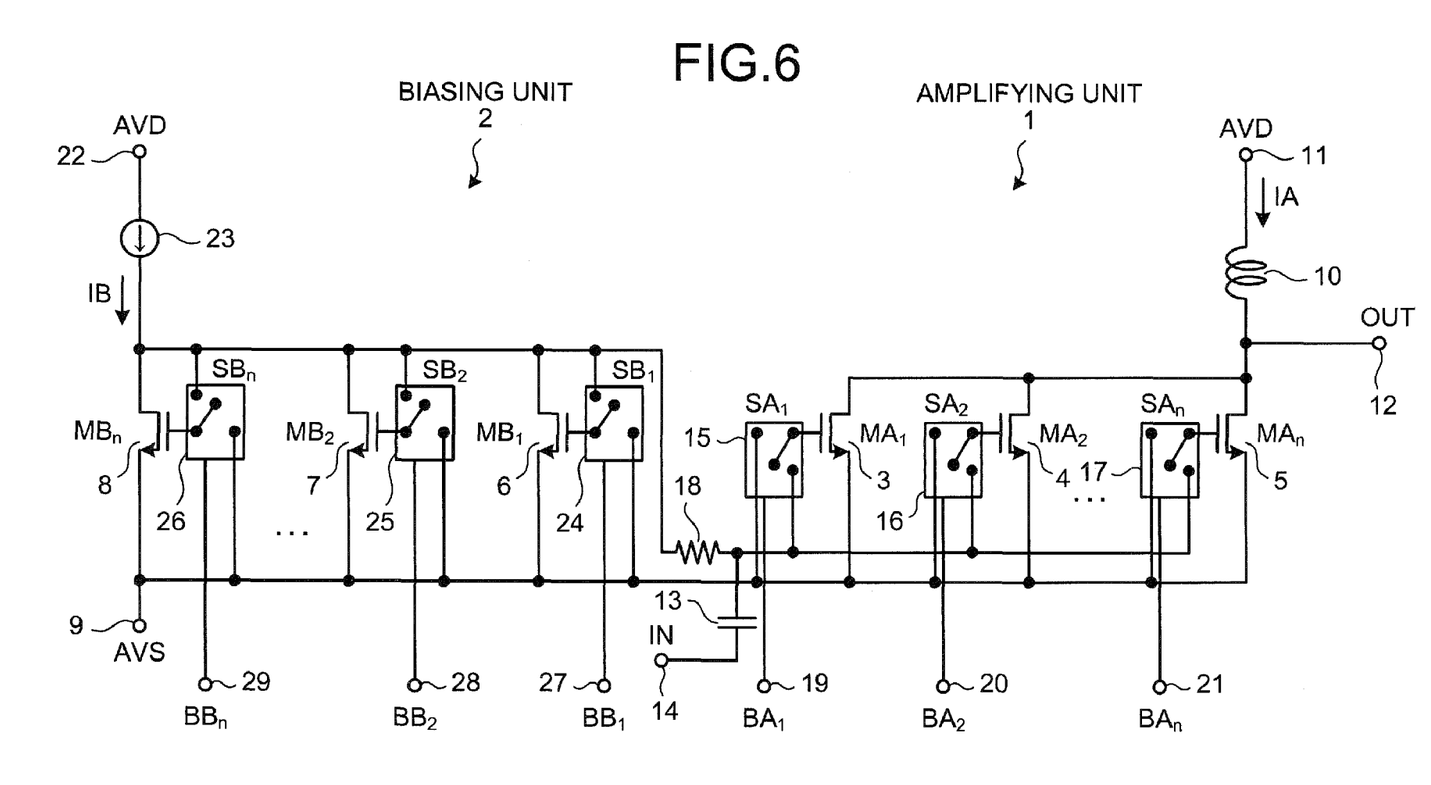
FIG. 6 is a circuit diagram of an amplifying circuit according to a third embodiment.

FIG. 6 is a circuit diagram of an amplifying circuit according to a third embodiment. As depicted in FIG. 6, in the amplifying circuit according to the third embodiment, in the amplifying unit 1, the gate terminals of the transistors MA 3, 4, and 5 are connected to the biasing unit 2 through the resistor 18 and simultaneously are connected to the input terminal (IN) 14 through the capacitor 13. However, these connections are controlled by switching of the switches SA 15, 16, and 17. Other aspects of the configuration are identical to those in the first embodiment.

The bias is applied to and the input signal is input to only the transistors whose gate terminals have been connected to the capacitor 13 and the resistor 18 by a switching of the switches SA 15, 16, and 17. The gate terminals of the transistors that have not been connected by the switches SA 15, 16, and 17 are connected to the ground (AVS) 9. That is, in the third embodiment, no bias is applied to and no input signal is input to transistors that are turned off in the amplifying unit 1 according to a temperature variation.

Figure 7:
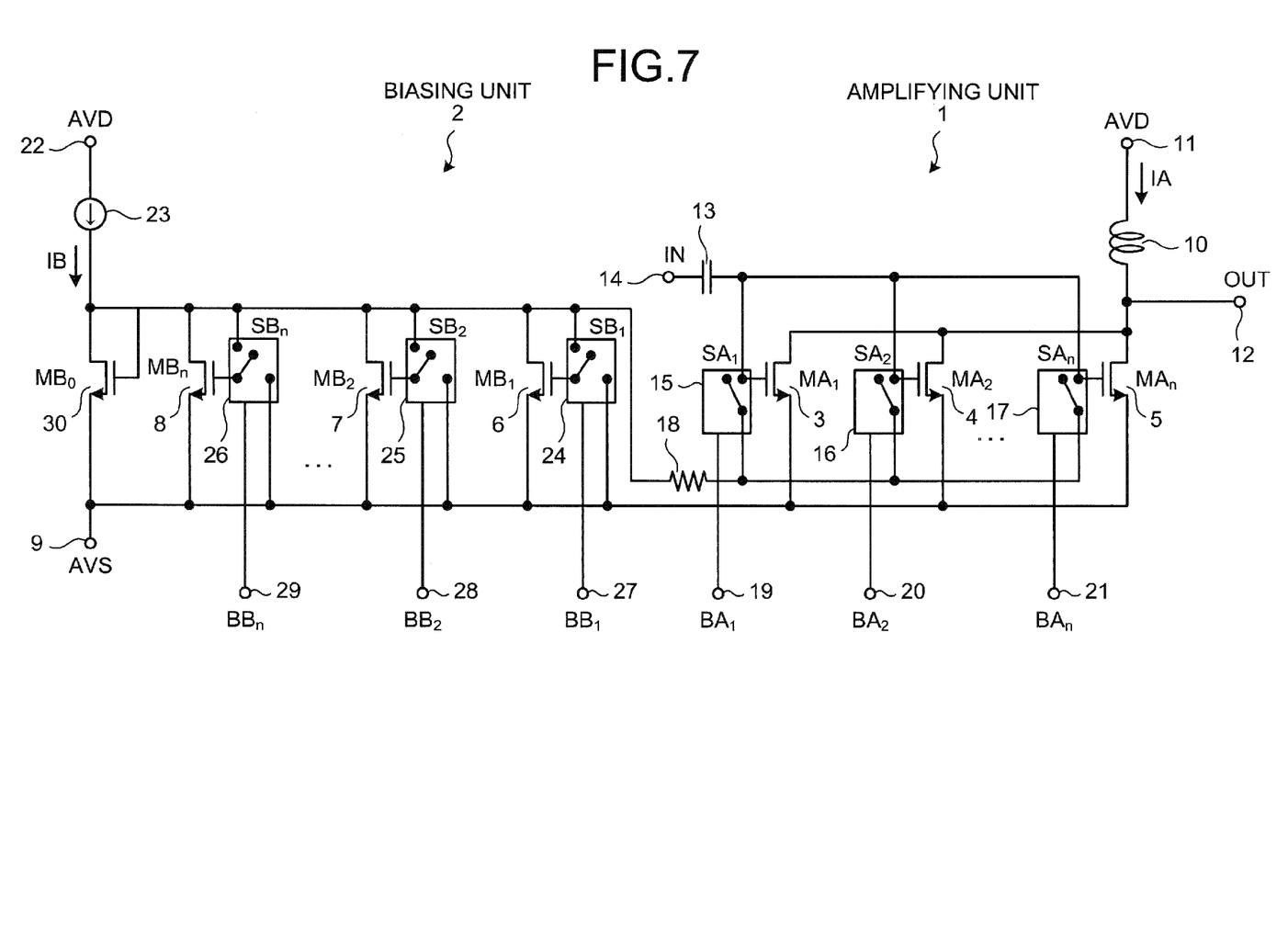
FIG. 7 is a circuit diagram of an amplifying circuit according to a fourth embodiment.

FIG. 7 is a circuit diagram of an amplifying circuit according to a fourth embodiment. As depicted in FIG. 7, in the amplifying circuit according to the fourth embodiment, in the biasing unit 2, an NMOS transistor MB$_0$ 30 is provided for correcting initial deviation. In this transistor MB$_0$ 30, a source terminal is connected to the ground (AVS) 9 and a gate terminal is connected to a drain terminal thereof and the current source 23. Other aspects of the configuration are identical to those in the first embodiment. The transistor MB$_0$ for correcting the initial deviation may be disposed in the second or the third embodiment.

Figure 8:
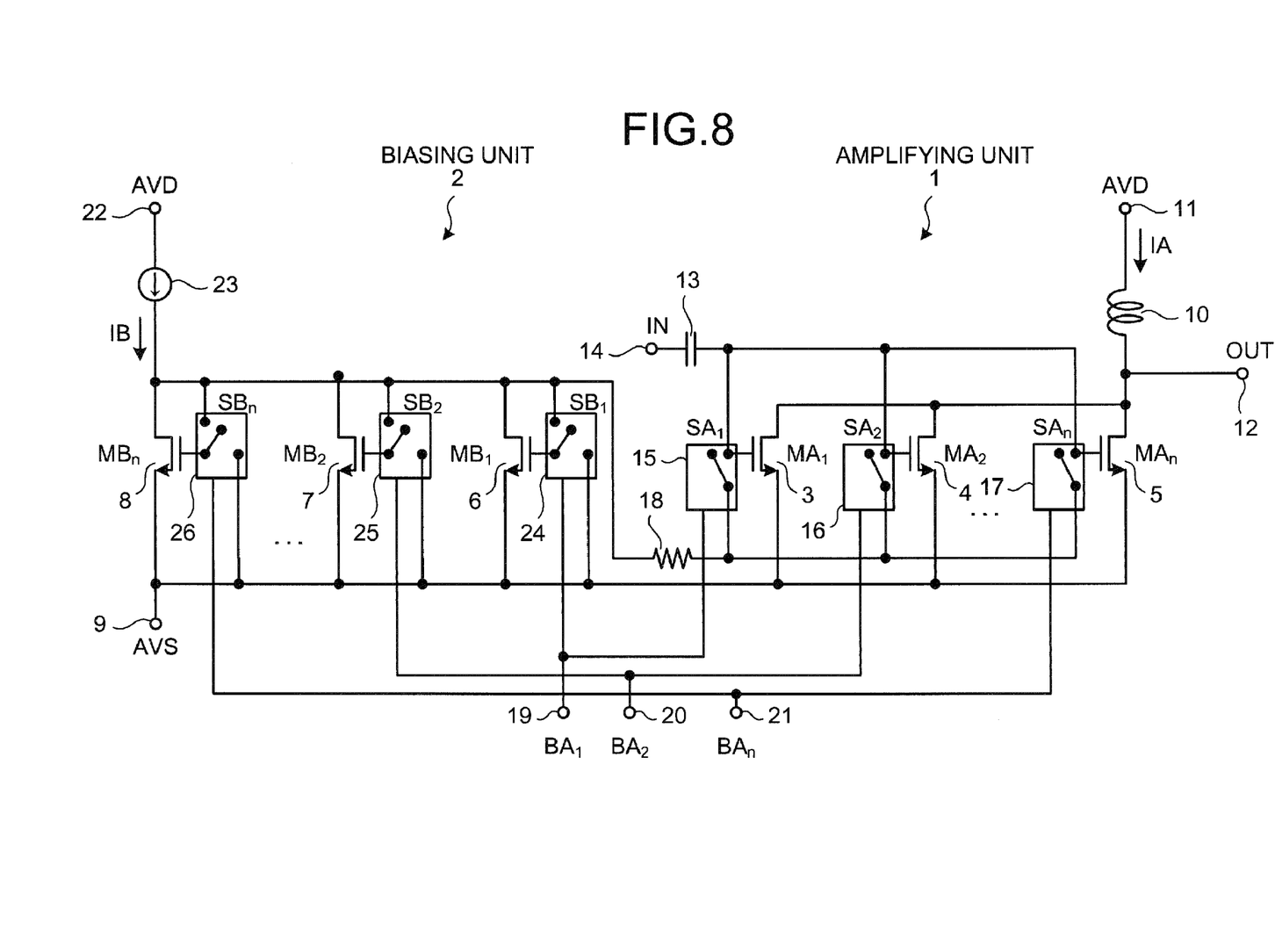
FIG. 8 is a circuit diagram of an amplifying circuit according to a fifth embodiment.

FIG. 8 is a circuit diagram of an amplifying circuit according to a fifth embodiment. As depicted in FIG. 8, in the amplifying circuit according to the fifth embodiment, the switches SA 15, 16, and 17 in the amplifying unit 1 and the switches SB 24, 25, and 26 in the biasing unit 2 are controlled by the same control signal. In this case, when the number of unit transistors is the same for each of the combinations of transistors MA$_1$ 3 and MB$_1$ 6, MA$_2$ 4 and MB$_2$ 7, and MA$_n$ 5 and MB$_n$ 8, the transistors of the same gate width Wg are simultaneously selected in the amplifying unit 1 and the biasing unit 2. Other aspects of the configuration are identical to those in the first embodiment. In the configuration of the second, the third, or the fourth embodiment, or in the configuration of the second or the third embodiment provided with the transistor for correcting the initial deviation, the same control signal may also control the switches SA 15, 16, and 17 in the amplifying unit 1 and the switches SB 24, 25, and 26 in the biasing unit 2.

Figure 9:
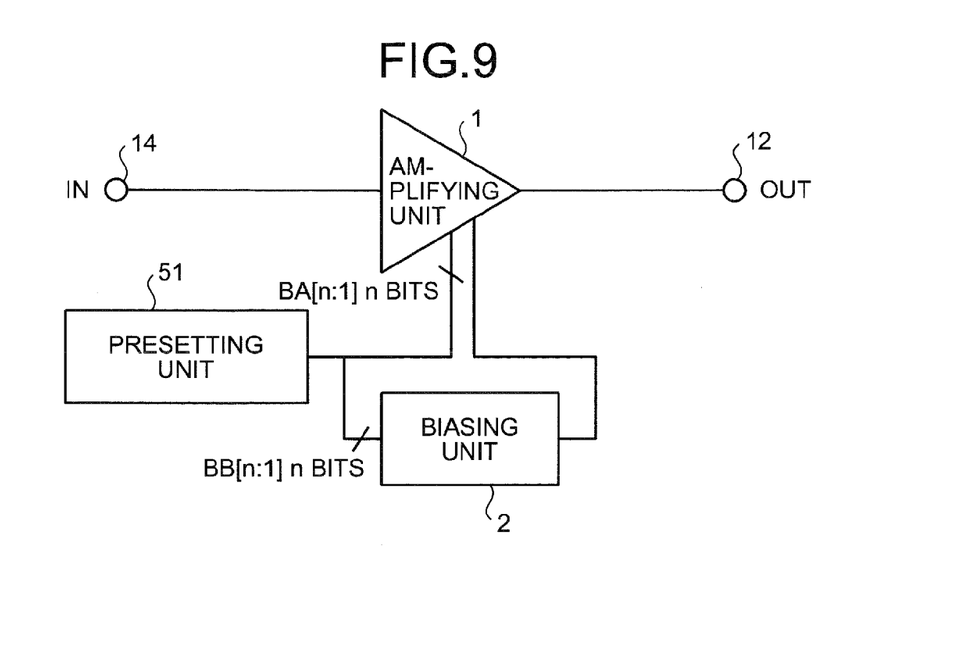
FIG. 9 is a diagram depicting a configuration of an amplifying circuit according to a sixth embodiment.

FIG. 9 is a diagram depicting a configuration of an amplifying circuit according to a sixth embodiment. As depicted in FIG. 9, the amplifying circuit according to the sixth embodiment is formed by combining a presetting unit 51 and the amplifying circuit (the amplifying unit 1 and the biasing unit 2) of any one among the first to the fifth embodiments. The presetting unit 51 monitors the initial characteristics of the amplifying circuit after manufacture and based on initial deviation, sets the initial values of a first control signal that determines the gate width Wg of the amplifying unit 1 and the initial values of a second control signal that determines the gate width Wg of the biasing unit 2. In FIG. 9, "BA[n:1]" denotes the n-bit first control signal and "BB[n:1]" denotes the n-bit second control signal (similarly in FIGS. 10 and 11).

Figure 10:
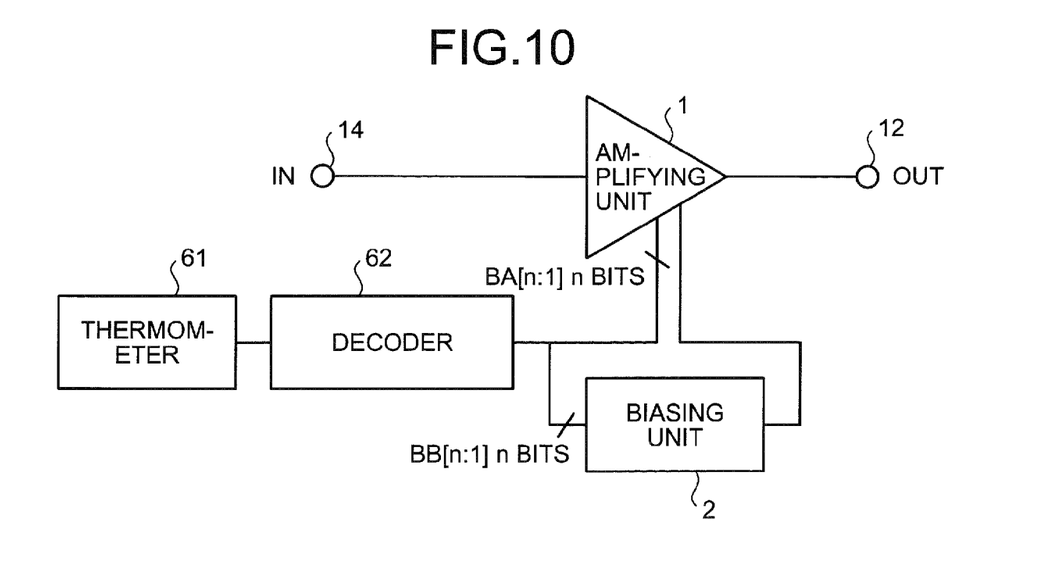
FIG. 10 is a circuit diagram of an amplifying circuit according to a seventh embodiment.

FIG. 10 is a circuit diagram of an amplifying circuit according to a seventh embodiment. As depicted in FIG. 10, the amplifying circuit according to the seventh embodiment is formed by combining a thermometer 61, a decoder 62, and the amplifying circuit (the amplifying unit 1 and the biasing unit 2) of any one among the first to the fifth embodiments. The thermometer 61 outputs a signal that corresponds to the temperature. The decoder 62 generates a first control signal that determines the gate width Wg of the amplifying unit 1 and a second control signal that determines the gate width Wg of the biasing unit 2, based on the signal output from the thermometer 61. The code BA[n:1] representing the first control signal and the code BB[n:1] representing the second control signal are controlled to be in proportion to 1/μ. That is, the gate width Wg and the gate bias Vg are controlled such that the gate width Wg is in proportion to 1/μ.

Figure 11:
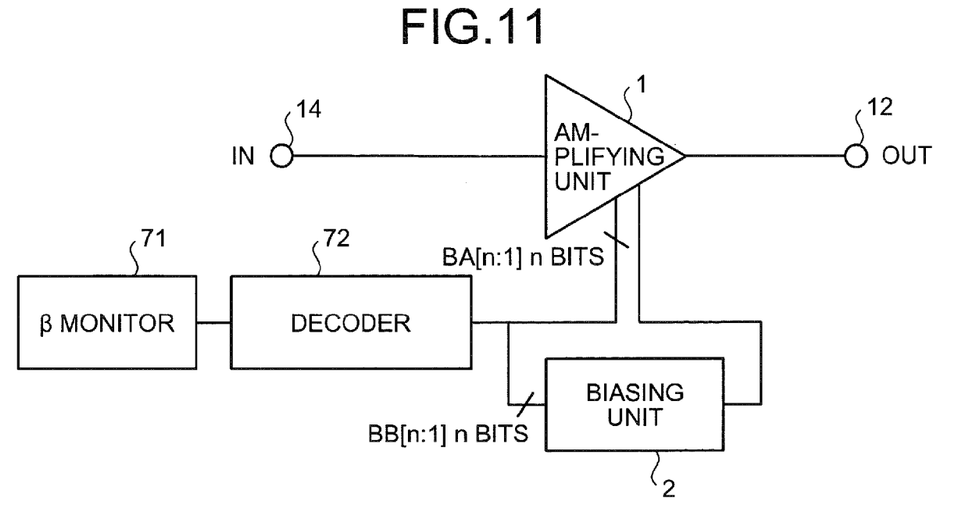
FIG. 11 is a circuit diagram of an amplifying circuit according to an eighth embodiment.

FIG. 11 is a circuit diagram of an amplifying circuit according to an eighth embodiment. As depicted in FIG. 11, the amplifying circuit according to the eighth embodiment is adapted to compensate manufacturing differences by combining a decoder 72 and the amplifying circuit (the amplifying unit 1 and the biasing unit 2) of any one among the first to the fifth embodiments, a β monitor 71. "β" in equation (1') is process information and the manufacturing differences correspond to the deviation of this β. Assuming that β per unit gate width is β0, the β monitor 71 outputs a signal corresponding to β0. A monitoring circuit of the β monitor 71 will be described hereinafter.

The decoder 72 generates based on the output signal of the β monitor 71, a first control signal that determines the gate width Wg of the amplifying unit 1 and a second control signal that determines the gate width Wg of the biasing unit 2. In the eighth embodiment, the code BA[n:1] representing the first control signal and the code BB[n:1] representing the second control signal are controlled to be in proportion to 1/β0. That is, the gate width Wg and the gate bias Vg are controlled such that the gate width Wg is in proportion to 1/β$_0$.

The monitoring circuit of the β monitor 71 will be described. The applicant proposed the monitoring circuit of the β monitor 71 in Japanese Patent Application No. 2006-999735. Description on the monitoring circuit will be described being excerpted from Japanese Patent Application No. 2006-999735 as an example of the monitoring circuit, and FIG. 5 of Japanese Patent Application No. 2006-999735 is attached hereto as FIG. 12 hereof.

Figure 12:
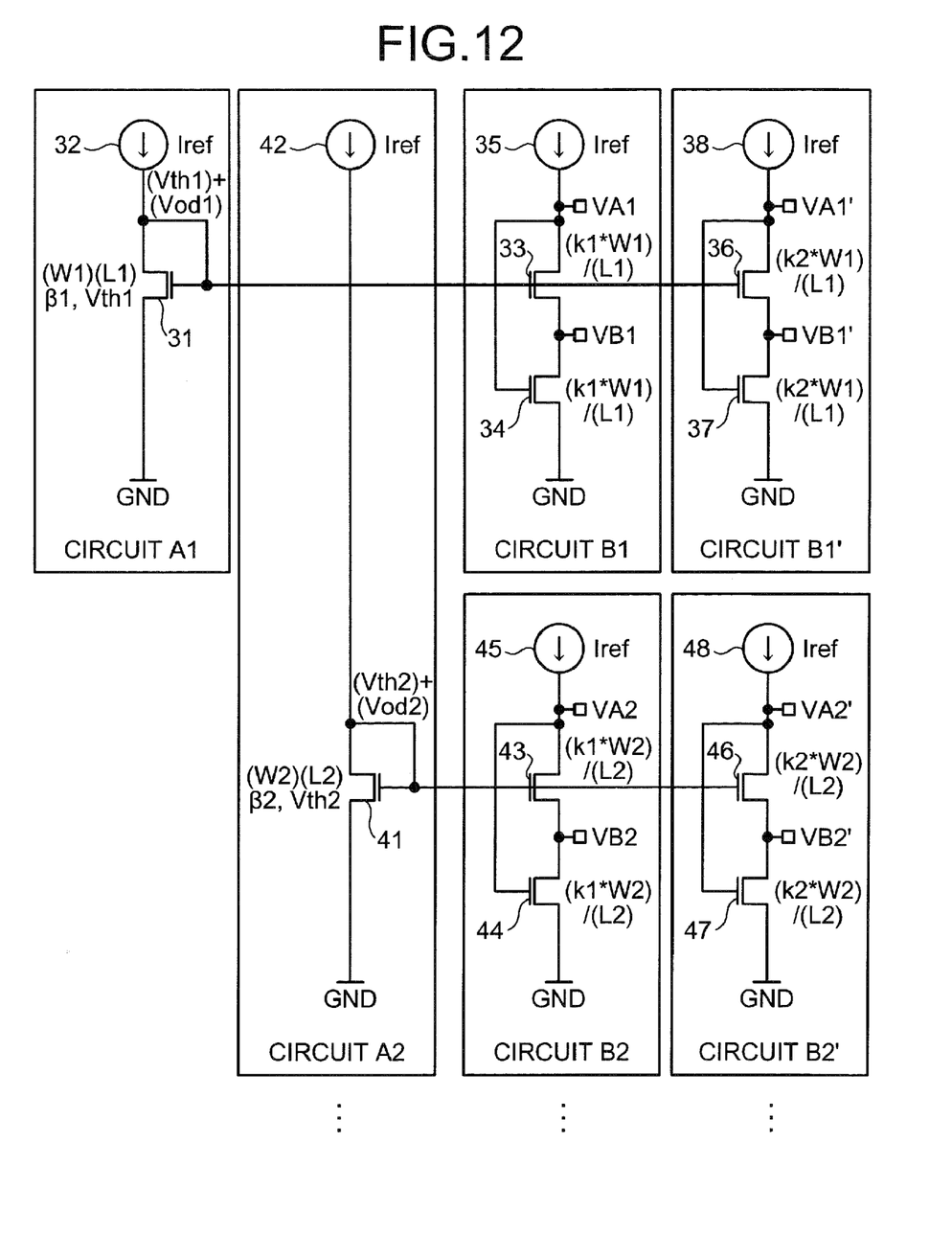
FIG. 12 is a circuit diagram of a β monitor of the amplifying circuit according the eighth embodiment.

FIG. 12 is a circuit diagram of the β monitor of the amplifying circuit according the eighth embodiment. In FIG. 12, the monitor circuit includes multiple transistors each of a gate width W and a gate length L that differs, and multiple current sources that each supply a reference current Iref. The monitor circuit depicted in FIG. 12 is basically divided into two parts, e.g., one part that includes transistors 31, 33, 34, 36, and 37 each of a gate length of "L1" and a gate width that differs and another part that includes transistors 41, 43, 44, 46, and 47 each of a gate length of "L2" and a gate width that differs.

The part including the transistors of the gate length L1 is formed by three circuits A1, B1, and B1'. The circuit A1 is formed by connecting a reference current source Iref 32 to the transistor 31 of a gate width W1 and the gate length L1. In contrast, the circuit B1 is formed by connecting in series the transistors 33 and 34 of a gate width that is k1 times as wide as W1 and connecting thereto a reference current source Iref 35; and the circuit B1' is similarly formed by connecting in series the transistors 36 and 37 of a gate width that is k2 times as wide as W1 and connecting thereto a reference current source Iref 38.

The part including the transistors of the gate length L2 is formed by three circuits A2, B2, and B2'. The circuit A2 includes the transistor 41 of a gate width W2 and a gate length L2, and a reference current source Iref 42. The circuit B2 includes the two transistors 43 and 44 of a gate width that is k1 times as wide as W2 and a gate length L2, and a reference current source Iref 45. The circuit B2' includes the two transistors 46 and 47 of a gate width that is k2 times as wide as W2 and the gate length L2, and a reference current source Iref 48.

Generally, a drain-source current Ids of a MOS transistor is expressed by second degree term using a gate-source voltage Vgs, a threshold voltage Vth, and a trans-conductance coefficient β. The trans-conductance coefficient β is obtained by the following equations using "β0" that is physically determined by the gate width W, the gate length L, the dielectric constant of a gate oxide, and the thickness of the oxide of the transistor.

$$Ids = \frac{\beta}{2}(Vgs - Vth)^2 \quad (1)$$

$$\beta = \frac{W}{L}\beta 0 \quad (2)$$

In FIG. 12, representing the trans-conductance coefficient of the transistor 31 in the circuit A1 as "β1" and the threshold voltage thereof as "Vth1", the trans-conductance coefficient of the transistors 33 and 34 in the circuit B1 is represented by "k1β1" and the trans-conductance coefficient of the transistors 36 and 37 in the circuit B1' is represented by "k2β1". Similarly, representing the trans-conductance coefficient of the transistor 41 in the circuit A2 as "β2", the trans-conductance coefficient of the transistors 43 and 44 is k1 times as large as β2 and the trans-conductance coefficient of the transistors 46 and 47 is k2 times as large as β2.

The value of the threshold voltage Vth is significantly dependent on the gate length and therefore, it is considered that the threshold voltage Vth1 of the transistor 31 has a value different from that of the threshold voltage Vth2 of the transistor 41. As described, although it is generally considered that a drain-source current Ids is related to a gate-source voltage Vgs by equation (1) including the above second degree term, calculation of the trans-conductance coefficient, the threshold voltage, etc., in FIG. 12 will be described assuming that, more correctly, the relation is according to equation (3), which includes an n-th degree term.

$$Ids = \frac{\beta}{2}(Vgs - Vth)^n \quad (3)$$

Representing an overdrive voltage as "Vod1" for the transistor 31 of FIG. 12, the following equation holds using:

$Vgs=Vth1+Vod1$; $Ids=Iref$; $\beta=\beta1$; and $Vth=Vth1$.

$$Iref = \frac{\beta1}{2}(Vod1)^n \quad (4)$$

Representing a drain potential of the transistor 33 as "VA1" and a source potential thereof as "VB1", the following equation holds.

$$Vgs = Vth1 + Vod1 - V_{B1} \quad (5)$$
$$Iref = \frac{k1\beta1}{2}(Vod1 - V_{B1})^n$$

The following equation holds for the transistor 34.

$$Vgs = V_{A1} \quad (6)$$
$$Iref = \frac{k1\beta1}{2}(V_{A1} - Vth1)^n$$

From equations (4) and (5), the following equation is obtained for the overdrive voltage.

$$Vod1 = k1^{\frac{1}{n}} \times V_{B1} / (k1^{\frac{1}{n}} - 1) \quad (7)$$

From equations (5) and (6), the following equation is obtained for the threshold voltage.

$$Vth = V_{A1} - V_{B1} / (k1^{\frac{1}{n}} - 1) \quad (8)$$

From equations (5) and (7), the following equation is obtained for the trans-conductance coefficient.

$$\beta1 = 2Iref(k1^{\frac{1}{n}} - 1)^n / k1(V_{B1})^n \quad (9)$$

"β1" obtained from equation (9) is used as β0 of the eighth embodiment. When the β monitor 71 is capable of monitoring β0, the configuration of the β monitor 71 is not limited to that of FIG. 12.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifying circuit comprising:
   an amplifying unit comprising a first transistor unit including a plurality of transistors coupled in parallel and having a gate width that is controllable and is controlled based on a first control signal; and
   a biasing unit that supplies a bias to a gate terminal of each the plurality of transistors,
   wherein an input signal is input to the gate terminal of a selected transistor of the plurality of transistors while the bias is supplied to the gate terminal of the selected transistor.

2. The amplifying circuit according to claim 1, wherein the plurality of transistors have an identical gate length and differing gate widths, and the first control signal is used to select, in the first transistor unit, a transistor to contribute to amplification of the input signal.

3. The amplifying circuit of according to claim 1, wherein the biasing unit comprises a second transistor unit having a gate width that is controllable and is controlled based on a second control signal for controlling the bias.

4. The amplifying circuit according to claim 3, wherein the biasing unit comprises a transistor to correct initial deviation.

5. The amplifying circuit according to claim 3, wherein the second transistor unit is configured by connecting in parallel a plurality of transistors having an identical gate length and differing gate widths, and the second control signal is used to select, in the second transistor unit, a transistor to contribute to supply of a bias.

6. The amplifying circuit according to claim 5, wherein transistors having an identical gate width are simultaneously selected in the first and the second transistor units.

7. The amplifying circuit according to claim 3, wherein current flowing in the biasing unit is constant.

8. The amplifying circuit according to claim 5, wherein the transistors having identical gate lengths and differing gate widths in the first transistor unit and in the second transistor unit are configured by connecting, in parallel, one or more unit transistors having respectively identical gate lengths and identical gate widths.

9. The amplifying circuit according to claim 3, further comprising:
   a presetting unit that sets the first and the second control signals based on initial deviations in manufacture of the amplifying unit and the biasing unit.

10. The amplifying circuit according to claim 3, further comprising:
    a thermometer; and
    a decoder that generates the first and the second control signals based on a signal output from the thermometer.

11. The amplifying circuit according to claim 3, further comprising:
    a monitor that obtains information on deviations in manufacture; and
    a decoder that generates the first and the second control signals based on a signal output from the monitor.

12. The amplifying circuit according to claim 4, further comprising:
    a presetting unit that sets the first and the second control signals based on initial deviations in manufacture of the amplifying unit and the biasing unit.

13. The amplifying circuit according to claim 4, further comprising:

a thermometer; and a decoder that generates the first and the second control signals based on a signal output from the thermometer.

14. The amplifying circuit according to claim 4, further comprising:

a monitor that obtains information on deviations in manufacture; and a decoder that generates the first and the second control signals based on a signal output from the monitor.

15. The amplifying circuit according to claim 6, further comprising:

a presetting unit that sets the first and the second control signals based on initial deviations in manufacture of the amplifying unit and the biasing unit.

16. The amplifying circuit according to claim 6, further comprising:

a thermometer; and a decoder that generates the first and the second control signals based on a signal output from the thermometer.

17. The amplifying circuit according to claim 6, further comprising:

a monitor that obtains information on deviations in manufacture; and a decoder that generates the first and the second control signals based on a signal output from the monitor.

* * * * *